(12) United States Patent
Lim et al.

(10) Patent No.: US 11,668,983 B2
(45) Date of Patent: Jun. 6, 2023

(54) DISPLAY APPARATUS

(71) Applicant: Samsung Display Co., Ltd., Yongin-si (KR)

(72) Inventors: Seungjin Lim, Hwaseong-si (KR); Youngsoo No, Seoul (KR); Jong-Nam Lee, Hwaseong-si (KR); Chung Yi, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 19 days.

(21) Appl. No.: 16/930,167

(22) Filed: Jul. 15, 2020

(65) Prior Publication Data

US 2021/0151541 A1 May 20, 2021

(30) Foreign Application Priority Data

Nov. 18, 2019 (KR) .......................... 10-2019-0147990

(51) Int. Cl.
| | | |
|---|---|---|
| *G02F 1/1345* | (2006.01) | |
| *G02F 1/1335* | (2006.01) | |
| *H01L 27/32* | (2006.01) | |
| *G02F 1/1368* | (2006.01) | |

(52) U.S. Cl.
CPC .... *G02F 1/13452* (2013.01); *G02F 1/133512* (2013.01); *G02F 1/1368* (2013.01); *H01L 27/3276* (2013.01)

(58) Field of Classification Search
CPC ....................... G02F 1/133512; G02F 1/13452
See application file for complete search history.

(56) References Cited

U.S. PATENT DOCUMENTS

| | | | |
|---|---|---|---|
| 2014/0118969 A1 | 5/2014 | Lee | |
| 2018/0342821 A1* | 11/2018 | Komiyama | ............ H01R 12/57 |
| 2019/0219863 A1* | 7/2019 | Tezen | ................ G02F 1/133308 |

FOREIGN PATENT DOCUMENTS

| | | |
|---|---|---|
| KR | 10-2009-0036266 | 3/2009 |
| KR | 10-2019-0009134 | 1/2019 |
| KR | 10-1979361 | 5/2019 |

* cited by examiner

*Primary Examiner* — Dung T Nguyen
(74) *Attorney, Agent, or Firm* — H.C. Park & Associates, PLC

(57) ABSTRACT

A display apparatus including a display panel having a front surface and a rear surface opposite to the front surface and including a plurality of display pads disposed on the front surface and arranged in one direction, a flexible printed circuit board connected to the display pads and bent toward the rear surface of the display panel along a virtual bending axis extending in the one direction, and a shielding member disposed on the flexible printed circuit board, wherein the flexible printed circuit board includes, based on a point of intersection with the bending axis in the one direction, a first bending region adjacent to the display pads and a second bending region adjacent to the rear surface of the display panel, and the shielding member covers the second bending region.

18 Claims, 13 Drawing Sheets

DISPLAY APPARATUS

CROSS-REFERENCE TO RELATED APPLICATION

This application claims priority from and the benefit of Korean Patent Application No. 10-2019-0147990, filed on Nov. 18, 2019, which is hereby incorporated by reference for all purposes as if fully set forth herein.

BACKGROUND

Field

Exemplary embodiments/implementations of the invention relate generally to a display apparatus, and more specifically to, a display apparatus with improved reliability.

Discussion of the Background

A display apparatus connects a printed circuit board to a display panel after the display panel is manufactured. For example, a tape automated bonding (TAB) mounting method bonds a flexible printed circuit board to a display panel using an anisotropic conductive film (ACF).

The above information disclosed in this Background section is only for understanding of the background of the inventive concepts, and, therefore, it may contain information that does not constitute prior art.

SUMMARY

Devices constructed according to exemplary embodiments of the invention are capable of providing a display apparatus which prevents or reduces delamination of a printed circuit board occurring when the printed circuit board is bent.

Additional features of the inventive concepts will be set forth in the description which follows, and in part will be apparent from the description, or may be learned by practice of the inventive concepts.

One or more embodiments of the inventive concepts provide a display apparatus including a display panel having a front surface and a rear surface opposite to the front surface and including a plurality of display pads disposed on the front surface and arranged in one direction, a flexible printed circuit board connected to the display pads and bent toward the rear surface of the display panel along a virtual bending axis extending in the one direction, and a shielding member disposed on the flexible printed circuit board, wherein the flexible printed circuit board includes, based on a point of intersection with the bending axis in the one direction, a first bending region adjacent to the display pads and a second bending region adjacent to the rear surface of the display panel, and the shielding member covers the second bending region.

In an embodiment, the shielding member may cover a portion of the first bending region.

In an embodiment, in the shielding member, the length of the shielding member covering the portion of the first bending region from the boundary of the first bending region and the second bending region may be 300 μm or less.

In an embodiment, the shielding member may further include an adhesion layer which is in contact with the flexible printed circuit board and a fabric layer disposed on the adhesion layer.

In an embodiment, the shielding member may further include an adhesive film disposed between the flexible printed circuit board and the adhesion layer, and the adhesive film may include a first adhesion layer covering the flexible printed circuit board, a film layer disposed on the first adhesion layer and including any one of polyimide (PI) and polyethylene terephthalate (PET), and a second adhesion layer disposed on the film layer.

In an embodiment, the flexible printed circuit board may include a flexible circuit board including a front surface on which the shielding member is disposed and a rear surface opposite to the front surface, and a driving chip mounted on the rear surface of the flexible circuit board.

In an embodiment, the display apparatus may further include a spacer disposed on the rear surface of the flexible circuit board and surrounding the driving chip.

In an embodiment, the display panel may include side surfaces connecting the front surface of the display panel and the rear surface of the display panel, and the display apparatus may further include, a stress relief member in contact with the rear surface of the flexible printed circuit board overlapping one side surface adjacent to the display pads among the side surfaces and the first bending region.

In an embodiment, the display apparatus may further include a protection member disposed between said display panel and the second bending region.

In an embodiment, the display apparatus may further include a main printed circuit board connected to the second bending region, wherein the main printed circuit board is disposed on the protection member.

In an embodiment, the display panel may include side surfaces connecting the front surface of the display panel and the rear surface of the display panel, and one side surface among the side surfaces which is adjacent to the display pads may include a first inclined surface inclined at a predetermined angle from the front surface of the display panel, a second inclined surface inclined at a predetermined angle from the rear surface of the display panel, and a side surface connecting the first inclined surface and the second inclined surface.

In an embodiment, the display pads and the flexible circuit board may be bonded using an anisotropic conductive film (ACF), and the bonding length of the anisotropic conductive film in the cross direction intersecting the one direction may be 150 μm to 250 μm.

In one or more embodiments of the inventive concepts, a display apparatus includes a display panel having a front surface and a rear surface opposite to the front surface and including a plurality of display pads disposed on the front surface and arranged in one direction, a flexible printed circuit board connected to the display pads and bent toward the rear surface of the display panel with a predetermined radius of curvature, and a shielding member disposed on the flexible printed circuit board, wherein the flexible printed circuit board includes, based on a point at which the radius of curvature is the smallest, a first bending region adjacent to the display pads and a second bending region adjacent to the rear surface of the display panel, and the shielding member covers the second bending region.

In an embodiment, the shielding member may cover a portion of the first bending region.

In an embodiment, in the shielding member, the length of the shielding member covering the portion of the first bending region from the boundary of the first bending region and the second bending region may be 300 μm or less.

In an embodiment, the shielding member may further include an adhesion layer which is in contact with the flexible printed circuit board and a fabric layer disposed on the adhesion layer.

In an embodiment, the shielding member may further include an adhesive film disposed between the flexible printed circuit board and the adhesion layer, and the adhesive film may include a first adhesion layer covering the flexible printed circuit board, a film layer disposed on the first adhesion layer and including any one of polyimide (PI) and polyethylene terephthalate (PET), and a second adhesion layer disposed on the film layer.

In an embodiment, the flexible printed circuit board may include a flexible circuit board including a front surface on which the shielding member is disposed and a rear surface opposite to the front surface, and a driving chip mounted on the rear surface of the flexible circuit board.

In an embodiment, the display apparatus may further include a spacer disposed on the rear surface of the flexible circuit board and surrounding the driving chip.

In an embodiment, the display pads and the flexible circuit board may be bonded using an anisotropic conductive film (ACF), and the bonding length of the anisotropic conductive film in the cross direction intersecting the one direction may be 150 μm to 250 μm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
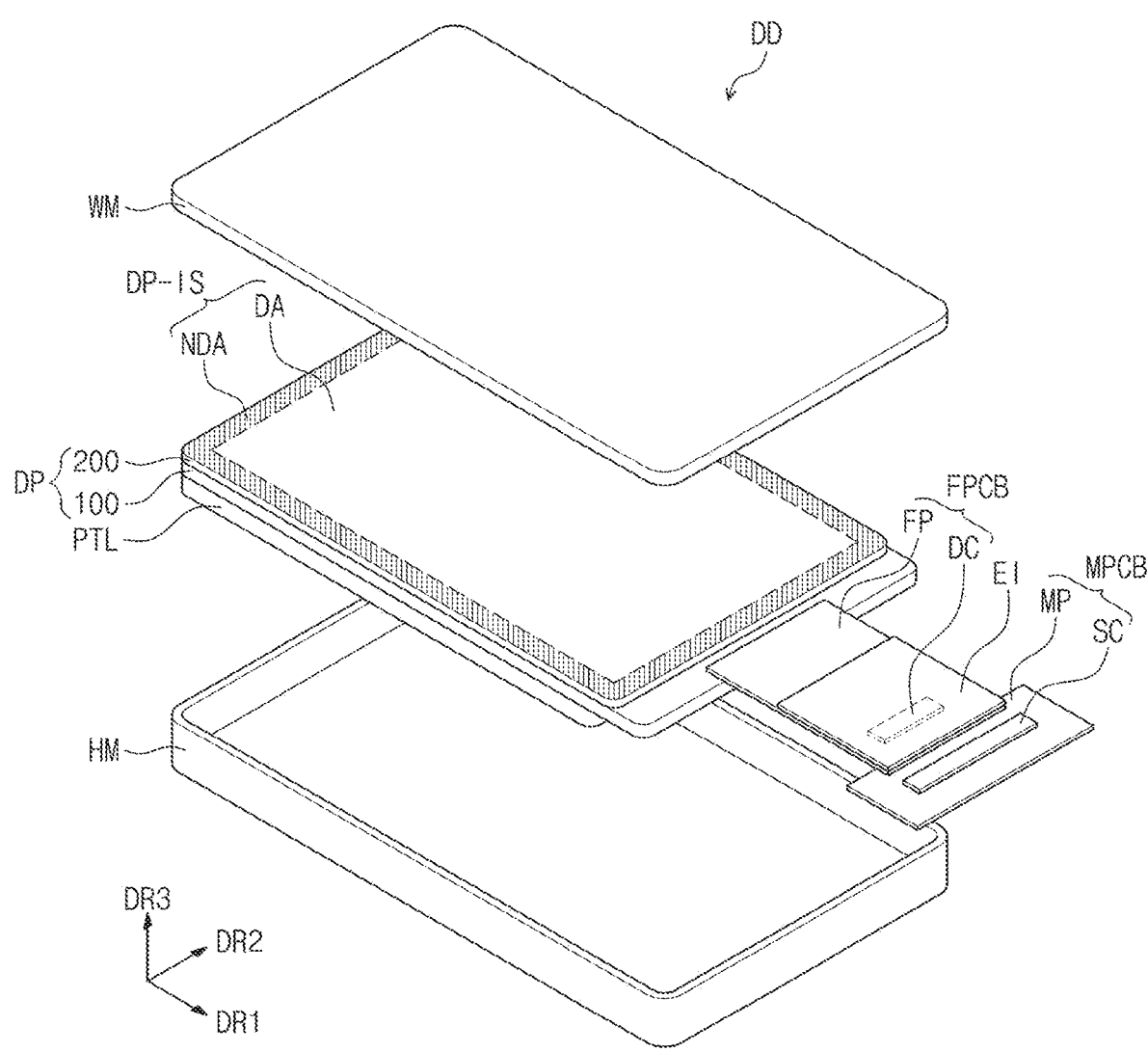
FIG. 1 is an exploded perspective view of a display apparatus according to an embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
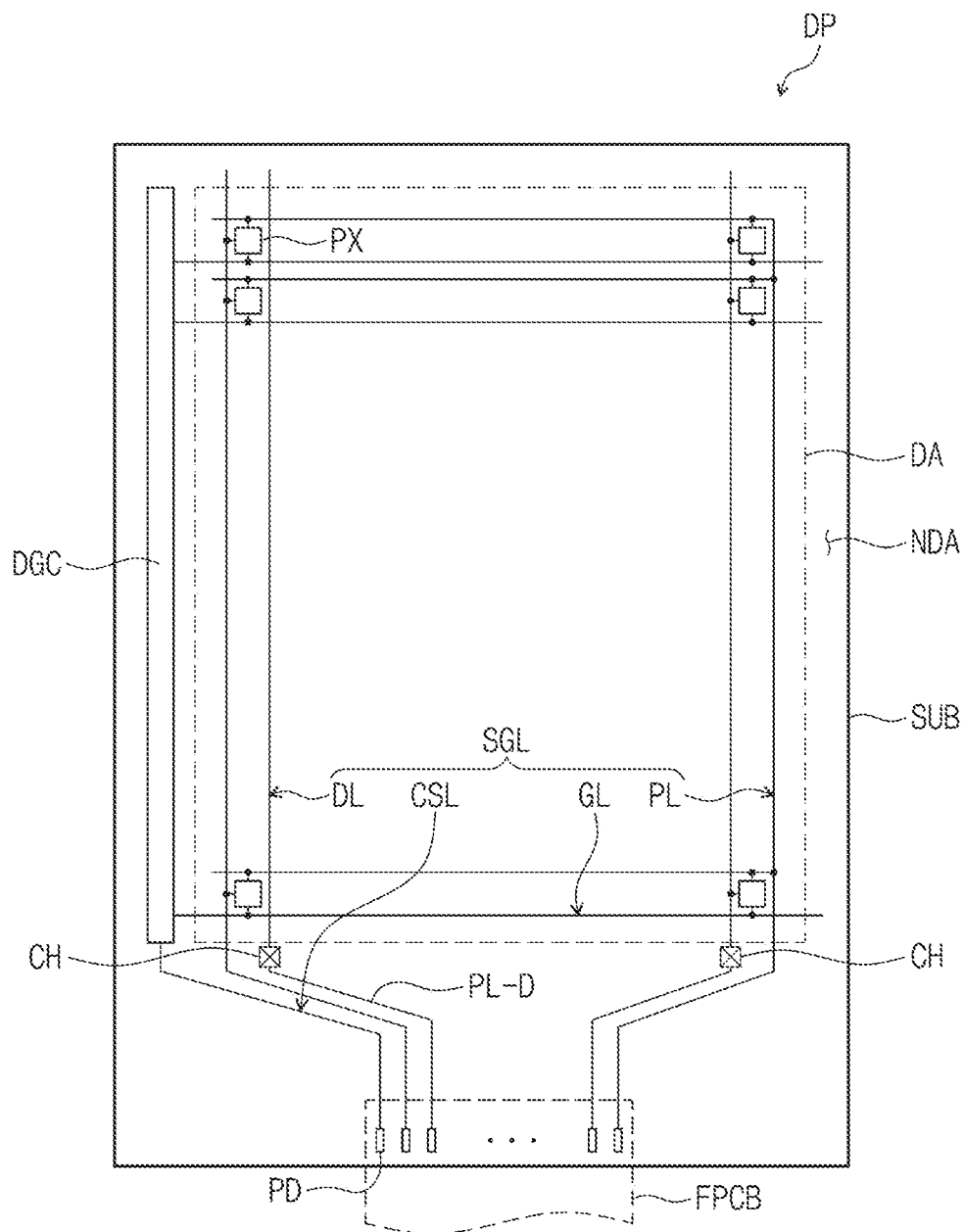
FIG. 2 is a plan view of a display panel according to an embodiment of the inventive concepts.
Figure 3A:
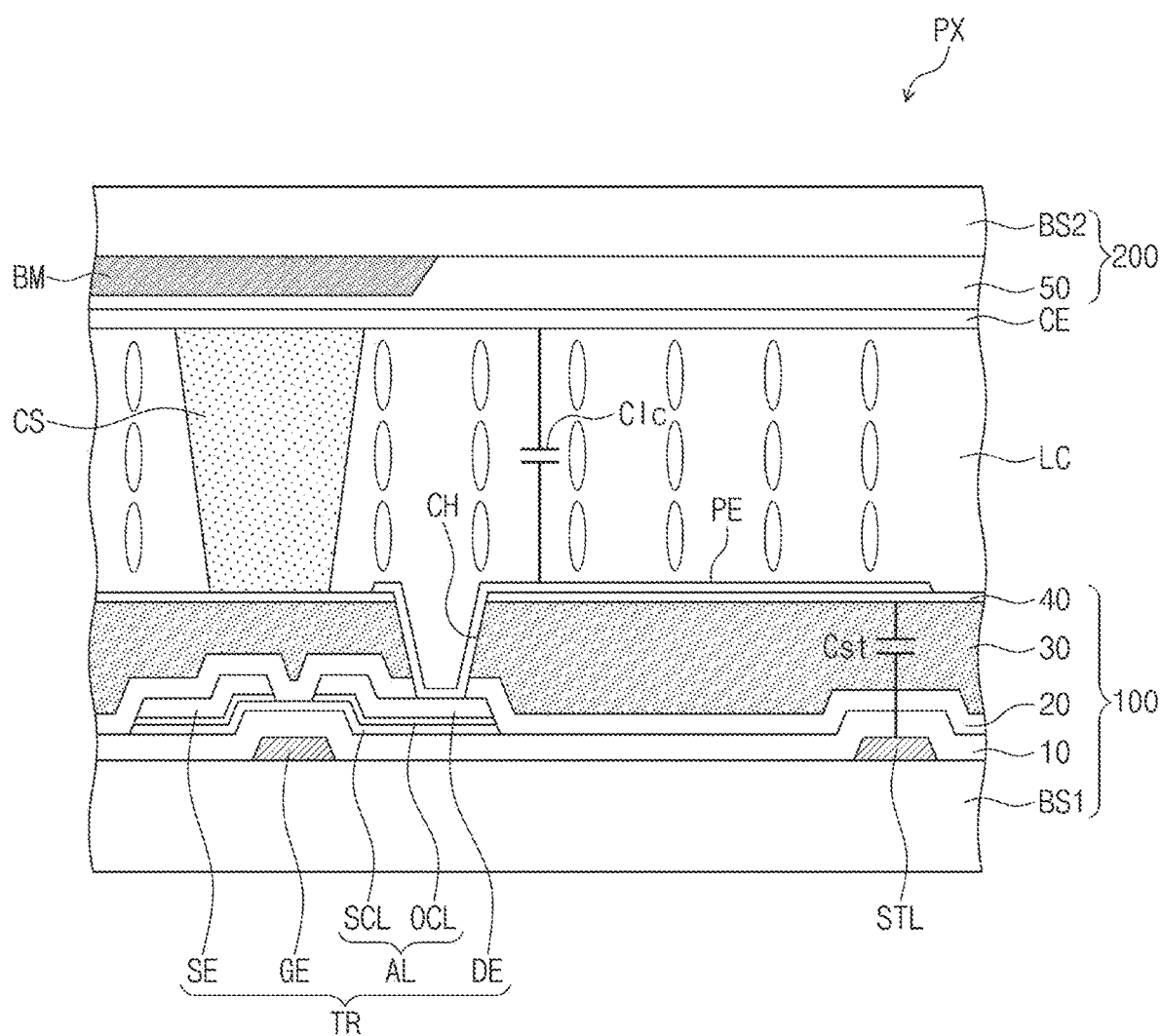
FIG. 3A is a cross-sectional view of a display panel according to an embodiment of the inventive concepts.
Figure 3B:
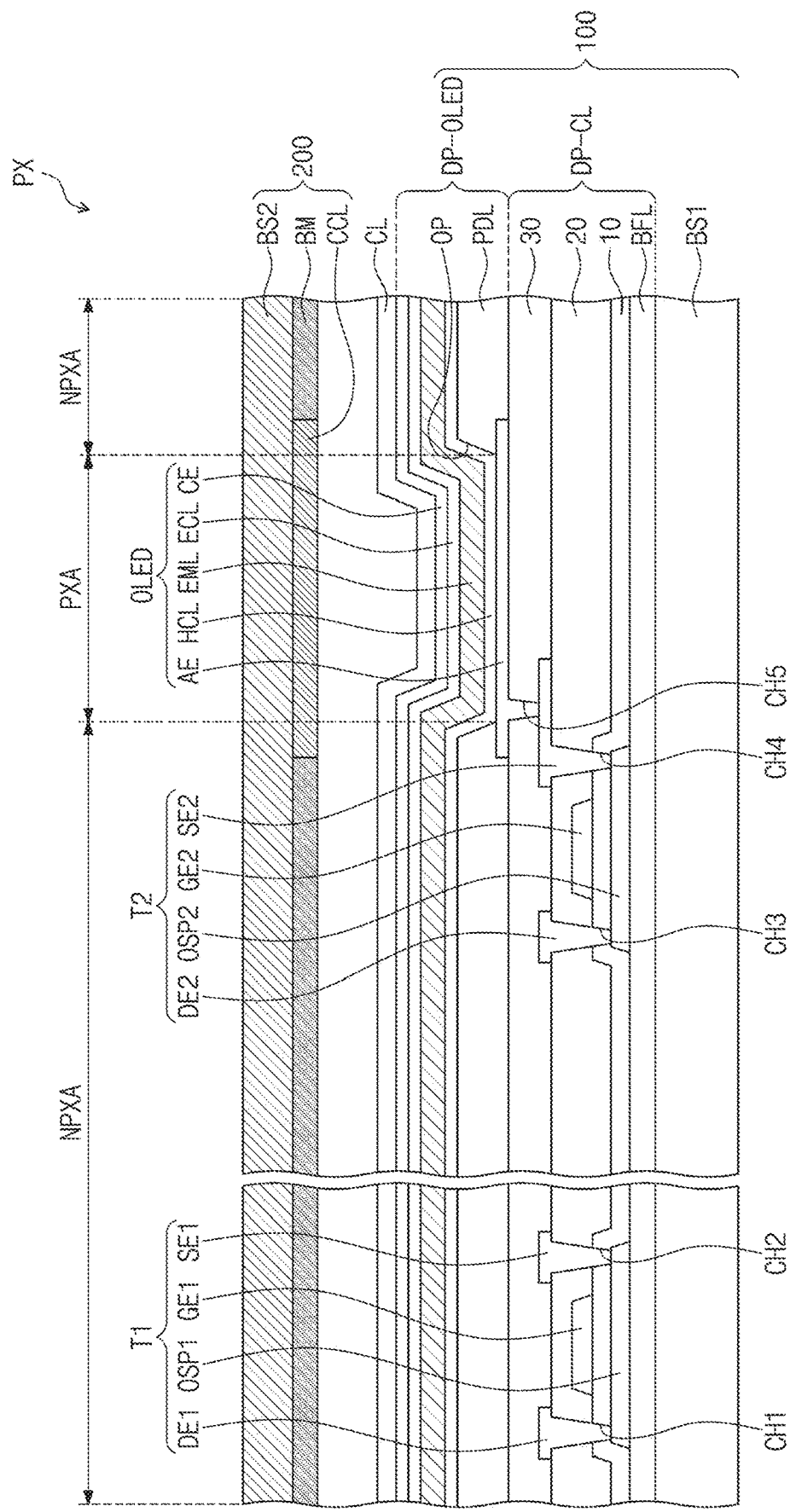
FIG. 3B is a cross-sectional view of a display panel according to an embodiment of the inventive concepts.
Figure 3C:
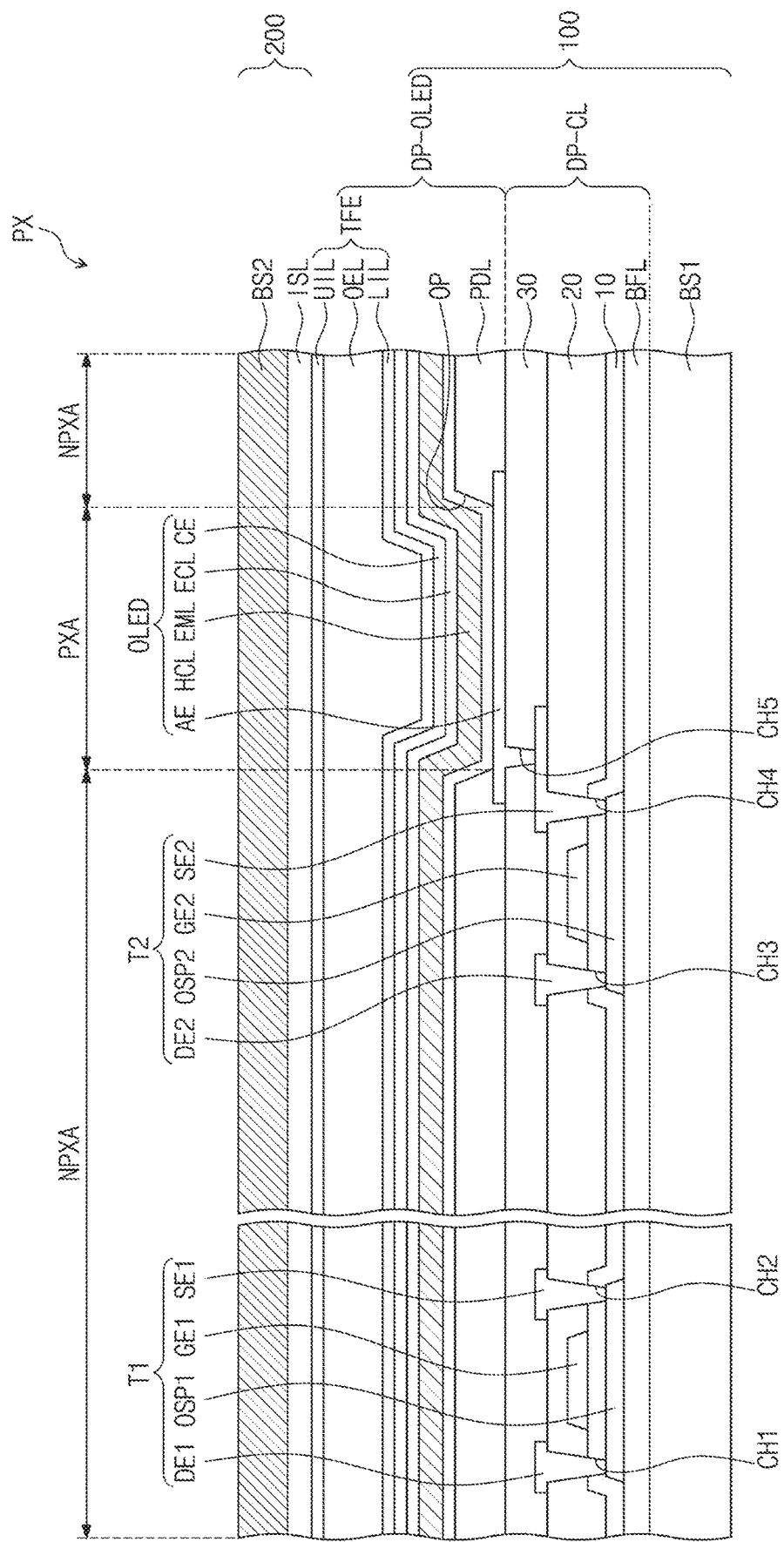
FIG. 3C is a cross-sectional view of a display panel according to an embodiment of the inventive concepts.

FIG. 1 is an exploded perspective view of a display apparatus according to an embodiment of the inventive concepts. FIG. 2 is a plan view of a display panel according to an embodiment of the inventive concepts. FIG. 3A is a cross-sectional view of a display panel according to an embodiment of the inventive concepts. FIG. 3B is a cross-sectional view of a display panel according to an embodiment of the inventive concepts. FIG. 3C is a cross-sectional view of a display panel according to an embodiment of the inventive concepts.

The display apparatus DD includes a window WM, a display panel DP, a flexible printed circuit board FPCB, a shielding member EI, a main printed circuit board MPCB, a protection member PTL, and a housing member HM.

The window WM is disposed on an upper portion of the display panel DP. The window WM prevents impacts applied from the outside and the penetration of foreign materials to protect the display panel DP. The window WM may be made of a transparent material capable of emitting an image. For example, the window WM may be composed of glass, sapphire, plastic, and the like. The window WM is illustrated as being a single layer, but is not limited thereto. The window WM may include a plurality of layers. Meanwhile, although not illustrated, the window WM may further include a bezel region corresponding to a non-display region NDA to be described later, and is not limited to any one embodiment.

The display panel DP may include a first display substrate 100 and a second display substrate 200. The second display substrate 200 may be disposed on the first display substrate 100. Between the first display substrate 100 and the second display substrate 200, a gray scale display layer for generating an image may be disposed. The gray scale display layer may include any one of a liquid crystal layer, an organic light emitting layer, or an electrophoretic layer depending on the type of a display panel.

The display panel DP may display an image through a display surface DP-IS The display surface DP-IS may be parallel to a plane defined by a first direction axis DR1 and a second direction axis DR2. The display surface DP-IS may include a display region DA and the non-display region NDA. The non-display region NDA is defined along the edge of the display surface DP-IS. The display region DA may be surrounded by the non-display region NDA. In an embodiment of the inventive concepts, the non-display region NDA may be disposed in a region on one side adjacent to the flexible circuit board FPCB.

The normal direction of the display surface DP-IS, that is, the thickness direction of the display panel DP is indicated by a third direction axis DR3. A front surface (or an upper surface) and a rear surface (or a lower surface) of each component described below are distinguished by the third direction axis DR3. However, the first to third direction axes DR1, DR2, and DR3 shown in the present embodiment are merely exemplary. Hereinafter, first to third directions are defined as directions indicated by the first to third direction axes DR1, DR2, DR3, respectively, and are given the same reference numerals.

In an embodiment of the inventive concepts, the display panel DP provided with a planar display surface DP-IS is illustrated, but embodiments of the inventive concepts are not limited thereto. The display apparatus DD may include a curved display surface or a three-dimensional display surface. The three-dimensional display surface may include a plurality of display regions indicating different directions. In addition, the display apparatus DD may be bent or folded based on a virtual extension line, but is not limited to any one embodiment.

The display panel DP is disposed on a lower portion of the window WM. The display panel DP generates an image and provides the image to the window WM.

According to an embodiment of the inventive concepts, the display panel DP may be any one among an organic light emitting diode display panel, a liquid crystal display panel, a plasma display panel, an electrophoretic display panel, a microelectromechanical system display panel, and an electrowetting display panel.

Referring to FIG. 2, a planar arrangement relationship between signal lines SGL and pixels PX of the display panel DP is illustrated. The signal lines SGL include gate lines GL, data lines DL, a power line PL, and a control signal line CSL. The gate lines GL are each connected to a corresponding pixel PX, and the data lines DL are each connected to a corresponding pixel PX. The power line PL is connected to the pixels PX. The control signal line CSL may provide control signals to a gate driving circuit. The signal lines SGL overlap the display region DA and the non-display region NDA.

The plurality of gate lines GL are extended along the second direction DR2, and arranged along the first direction DR1. The plurality of data lines DL and the gate lines GL are insulated while crossing each other. The plurality of data lines DL are extended along the first direction DR1, and arranged along the second direction DR2.

Auxiliary signal lines PL-D are disposed to overlap the non-display region NDA and are connected to the data lines DL. The auxiliary signal lines PL-D connected to the data lines DL may be disposed on a different layer from the data lines DL. Through a contact-hole CH, the data lines DL may each be electrically connected to a corresponding auxiliary signal line among the auxiliary signal lines PL-D. The contact-hole CH passes through at least one insulation layer disposed between the data lines DL and the auxiliary signal lines PL-D. FIG. 2 exemplarily illustrates two contact-holes CH.

In an embodiment of the inventive concepts, the contact-hole CH may be omitted. The data lines DL and the auxiliary signal lines PL-D may be disposed on the same layer. At this time, among the data lines DL and the auxiliary signal lines PL-D, a data line and an auxiliary signal line connected to each other may be defined as one signal line. At this time, the data line and the auxiliary signal line connected to each other may be defined as different portions of one signal line.

Each of the plurality of pixels PX is connected to a corresponding gate line among the plurality of gate lines GL and a corresponding data line among the plurality of data lines DL. Each of the pixels PX may include a pixel driving circuit and a display element.

FIG. 2 exemplarily illustrates the pixels PX in a matrix form, but embodiments of the inventive concepts are not limited thereto. The pixels PX may be disposed in a pentile form.

A gate driving circuit GDC may be integrated into the display panel DP through an oxide silicon gate driver circuit (OSG) process or an amorphous silicon gate driver circuit (ASG) process.

The display panel DP according to the inventive concepts includes display pads PD. The display pads PD may be disposed in the non-display area NDA. The display pads PD may be arranged along the second direction DR2.

The display pads PD are connected to corresponding pixels PX, respectively. Some of the display pads PD are connected to corresponding pixels PX, and the rest of the pads may be connected to the driving circuit GDC.

Referring back to FIG. 1, the main printed circuit board MPCB may include a main circuit board MP and a signal control unit SC. The signal control unit SC may be connected to signal lines (not shown) disposed inside the main circuit board MP. The signal control unit SC receives image data and a control signal from an external graphic control unit (not shown). The signal control unit SC may provide a control signal to the display panel DP.

The flexible circuit board FPCB may be connected to the display panel DP and the main circuit board MPCB by a conductive adhesive member. The conductive adhesive member may include an anisotropic conductive film (ACF). Hereinafter, the conductive adhesive member will be described as being an anisotropic conductive film (ACF).

The flexible printed circuit board FPCB includes a flexible circuit board FP, a driving chip DC, and circuit board pads F-PD and M-PD (see FIG. 4B) to be described later. The flexible circuit board FP may have flexibility. Accordingly, the flexible circuit board FP may be provided in various forms corresponding to the purpose and form of the display panel DP.

In FIG. 1, one flexible printed circuit board FPCB is shown for convenience of description, but embodiments of the inventive concepts are not limited thereto. A plurality of flexible printed circuit boards arranged along the second direction DR2 may be included, or flexible printed circuit boards which make up a pair by overlapping some of the portions thereof, but embodiments of the inventive concepts are not limited thereto.

The driving chip DC may be mounted on the flexible circuit board FP in the form of a chip on film (COF). The driving chip DC may include driving elements for driving the pixels PX, for example, a data driving circuit.

The shielding member IE is disposed on the flexible printed circuit board FPCB. The shielding member IE may expose at least a portion of the flexible printed circuit board FPCB. The shielding member IE may prevent or reduce electrical interference between other components of the display apparatus DD and the flexible printed circuit board FPCB. In addition, the shielding member IE may block static electricity introduced from the outside and may be disposed on the flexible printed circuit board FPCB to protect the flexible printed circuit board FPCB.

The protection member PTL is disposed on a lower portion of the display panel DP. The protection member PTL may include functional layers which are necessary in order to assist the driving of the display panel DP. For example, the protection member PTL may include at least one among a support layer, an impact absorbing layer, a heat dissipating layer, and a light blocking layer.

The support layer supports the display panel DP. The support layer may include a thermoplastic resin. For example, the support layer may include polyethylene terephthalate (PET), and thus, may be excellent in fatigue strength, electrical properties, and heat resistance, and may be less affected by temperature and humidity.

The impact absorbing layer may be synthetic resin foam. The impact absorbing layer may be provided as a matrix layer including a plurality of pores. The pores have a porous structure, and thus, may easily absorb external impact applied to the display apparatus DD.

The light blocking layer may serve to solve the problem in that components disposed on the rear surface of the display panel DP are projected through the window WM. The light blocking layer may block light emitted to the rear surface from the display panel DP.

The housing member HM receives the display panel DP. The housing member HM may be coupled to the window WM and define the appearance of the display apparatus DD. The housing member HM absorbs impacts applied from the outside and prevents foreign materials/moisture and the like from penetrating into the display apparatus DD, thereby protecting components received in the housing member HM. Meanwhile, although not illustrated, the housing member HM may be provided in a form in which a plurality of housing members are coupled to each other.

Referring to FIG. 3A, the gray scale display layer of the display panel DP according to an embodiment of the inventive concepts may be a liquid crystal layer LC. Accordingly, the display panel DP may be a liquid crystal display panel. The pixel PX of the liquid crystal display panel may include a transistor TR, a liquid crystal capacitor Clc, and a storage capacitor Cst.

The transistor TR includes a control electrode GE connected to a gate line, an activation unit AL overlapping the control electrode GE, an input electrode SE connected to a data line, and an output electrode DE disposed spaced apart from the input electrode SE. The liquid crystal capacitor Clc includes a pixel electrode PE and a common electrode CE.

The storage capacitor Cst includes the pixel electrode PE and a portion of a storage line STL overlapping the pixel electrode PE.

The control electrode GE and the storage line STL are disposed on one surface of a first base substrate BS1. The first base substrate BS1 may be any one of a glass substrate, a plastic substrate, and a substrate containing polyimide (PI). On one surface of the first base substrate BS1, a first insulation layer 10 covering the control electrode GE and the storage line STL is disposed. The first insulation layer 10 may include at least one of an inorganic material or an organic material.

On the first insulation layer 10, the activation unit AL overlapping the control electrode GE is disposed. The activation unit AL may include a semiconductor layer SCL and an ohmic contact layer OCL. The semiconductor layer SCL is disposed on the first insulation layer 10, and the ohmic contact layer OCL is disposed on the semiconductor layer SCL.

The semiconductor layer SCL may include amorphous silicon or crystalline silicon. In addition, the semiconductor layer SCL may include a metal oxide semiconductor. The ohmic contact layer OCL may include a dopant doped at a higher density than the semiconductor layer SCL. The ohmic contact layer OCL may include two portions spaced apart from each other. In an embodiment of the inventive concepts, the ohmic contact layer OCL may have a single-body shape.

The output electrode DE and the input electrode SE are disposed on the activation unit AL. The output electrode DE and the input electrode SE are disposed spaced apart from each other. On the first insulation layer 10, a second insulation layer 20 covering the activation unit AL, the output electrode DE, and the input electrode SE is disposed. A third insulation layer 30 is disposed on the second insulation layer 20. The second insulation layer 20 and the third insulation layer 30 may include at least one of an inorganic material or an organic material. The third insulation layer 30 may an organic layer of a single layer which provides a flat surface. In the present embodiment, the third insulation layer 30 may include a plurality of color filters. On the third insulation layer 30, a fourth insulation layer 40 is disposed. The fourth insulation layer 40 may an insulation layer covering the color filters.

As shown in FIG. 3A, the pixel electrode PE is disposed on the fourth insulation layer 40. The pixel electrode PE is connected to the output electrode DE through the contacthole CH passing through the second insulation layer 20, the third insulation layer 30, and the fourth insulation layer 40. On the fourth insulation layer 40, an alignment film (not shown) covering the pixel electrode PE may be disposed.

The second base substrate BS2 may be any one of a glass substrate, a plastic substrate, and a substrate containing polyimide (PI). On a lower surface of the second base substrate BS2, a black matrix layer BM is disposed. That is, on the black matrix layer BM, openings corresponding to pixel regions may be defined. A spacer CS may be disposed to overlap the black matrix layer BM.

Insulation layers covering the black matrix layer BM are disposed on a lower surface of the second base substrate BS2. FIG. 3A exemplarily illustrates a fifth insulation layer 50 providing a flat surface. The fifth insulation layer 50 may include an organic material.

The common electrode CE is disposed on a lower surface of the second base substrate BS2. On the common electrode CE, an alignment film (not shown) may be disposed.

The common electrode CE according to an embodiment may include a transmissive metal such as a transparent conductive oxide (TCO).

A common voltage is applied to the common electrode CE. The common voltage may have a different value from a pixel voltage, or may have the same value. In a liquid crystal display panel in a vertical alignment (VA) mode, when a common voltage and a pixel voltage have the same value, the potential difference is zero, and at this time, a black colored screen may be displayed in the display region DA (see FIG. 1).

Meanwhile, the cross-section of the pixel PX shown in FIG. 3A is only exemplary. The first display substrate 100 and the second display substrate 200 may be reversed in the third direction DR3. The color filters may be disposed on the second display substrate 200.

Referring to FIG. 3A, a liquid crystal display panel in a vertical alignment mode has been exemplarily described. However, in an embodiment of the inventive concepts, any one mode among an In-Plane Switching (IPS) mode, a Fringe-Field Switching (FFS) mode, a Plane to Line Switching (PLS) mode, and a Vertical Alignment (VA) mode may be applied, and the liquid crystal display panel is not limited to any one specific mode.

Referring to FIG. 3B, the gray scale display layer of the display panel DP according to an embodiment of the inventive concepts may include an organic light emitting layer EML. Accordingly, the display panel DP may be an organic light emitting display panel. A pixel PX of an organic light emitting display panel may include a switching transistor T1, a driving transistor T2, and a light emitting diode OLED.

The organic light emitting display panel includes a display substrate 100 and an encapsulation substrate 200. The display substrate 100 includes a first base substrate BS1, a circuit element layer DP-CL disposed on the first base substrate BS1, a display element layer DP-OLED disposed on the display element layer DP-CL, and a cover layer CL disposed on the display element layer DP-OLED. The encapsulation substrate 200 may include a second base substrate BS2, a black matrix layer BM disposed on the second base substrate BS2, and a color conversion layer CCL.

The first base substrate BS1 may be any one of a glass substrate, a plastic substrate, and a substrate containing polyimide (PI). The circuit element layer DP-CL includes at least one insulation layer and a circuit element. The circuit element includes a signal line and a driving circuit of a pixel, and the like. The circuit element layer DP-CL may be formed through a forming process of an insulation layer, a semiconductor layer, and a conductive layer by coating, deposition, and the like, and a patterning process of an insulation layer, a semiconductor layer, and a conductive layer by a photolithography process.

In the present embodiment, the circuit element layer DP-CL may include a buffer film BFL, the first insulation layer 10, the second insulation layer 20, and the third insulation layer 30. The first insulation layer 10 and the second insulation layer 20 may each be an inorganic film and the third insulation layer 30 may be an organic film.

FIG. 3B exemplarily illustrates the arrangement relationship of a first semiconductor pattern OSP1, a second semiconductor pattern OSP2, a first control electrode GE1, a second control electrode GE2, a first input electrode DE1, a first output electrode SE1, a second input electrode DE2, a second output electrode SE2 all constituting the switching transistor T1 and the driving transistor T2. First, second, third, and fourth through-holes CH1, CH2, CH3, and CH4 are also exemplarily illustrated.

The display element layer DP-OLED includes a light emitting diode OLED. The display element layer DP-OLED may include an organic light emitting diode as the light emitting diode OLED. The display element layer DP-OLED includes a pixel definition film PDL. For example, the pixel definition film PDL may be an organic layer.

When the third insulation layer is an intermediate organic film, a first electrode AE is disposed on the intermediate organic film 30. The first electrode AE is connected to a second output electrode SE2 through a third through-hole CH5 passing through the intermediate organic film 30. On the pixel definition film PDL, an opening OP is defined. The opening OP of the pixel definition film PDL exposes at least a portion of the first electrode AE. The opening OP of the pixel definition film PDL is named as a light emitting opening to distinguish the same from the other openings.

As shown in FIG. 3B, the display panel DP may include a light emitting region PXA and a non-light emitting region NPXA adjacent to the light emitting region PXA. The non-light emitting region NPXA may surround the light emitting region PXA. In the present embodiment, the light emitting region PXA is defined so as to correspond to a certain portion of the first electrode AE exposed by the light emitting region.

A hole control layer HCL may be commonly disposed in the light emitting region PXA and the non-light emitting region NPXA. The hole control layer HCL includes a hole transport layer, and may further include a hole injection layer. On the hole control layer HCL, the light emitting layer EML is disposed. The organic light emitting layer EML may be commonly disposed in the light emitting region PXA and the non-light emitting region NPXA. However, embodiments of the inventive concepts are not limited thereto. In an embodiment, the organic light emitting layer EML may be disposed in the light emitting region PXA, and may not be disposed in the non-light emitting region NPXA. The organic light emitting layer EML may include an organic matter and/or an inorganic matter. The organic light emitting layer EML may generate predetermined light, for example, blue light.

An electron control layer ECL is disposed on the organic light emitting layer EML. The electron control layer ECL includes an electron transport layer, and may further include an electron injection layer. The hole control layer HCL and the electron control layer ECL may be commonly formed in the plurality of pixels PX using an open mask. On the electron control layer ECL, the second electrode CE is disposed. The second electrode CE is commonly disposed in a plurality of pixels. The cover layer CL for protecting the second electrode CE may be disposed on the second electrode CE. The cover layer CL may include an organic material or an inorganic material.

The second base substrate BS2 is disposed spaced apart from the cover layer CL. The second base substrate BS2 may be any one of a glass substrate, a plastic substrate, and a substrate containing polyimide (PI). Depending on the pixel PX, the color conversion layer CCL may transmit a first color light, or may convert the first color light to a second color light or a third color light. The color conversion layer CCL may include a quantum dot.

In an embodiment of the inventive concepts, the encapsulation substrate 200 may be substituted with a thin film encapsulation layer including a plurality of inorganic layers and an organic layer sealed by the inorganic layers. At this time, the black matrix layer BM and the color conversion layer CCL may be disposed on the thin film encapsulation layer.

Referring to FIG. 3C, the gray scale display layer of the display panel DP according to an embodiment of the inventive concepts may include the organic light emitting layer EML. Accordingly, the display panel DP may be an organic light emitting display panel. A pixel PX of an organic light emitting display panel may include a switching transistor T1, a driving transistor T2, and a light emitting diode OLED.

The organic light emitting display panel includes a lower substrate 100 and an upper substrate 200. The lower substrate 100 includes a first base substrate BS1, a circuit element layer DP-CL disposed on the first base substrate BS1, a display element layer DP-OLED disposed on the circuit element layer DP-CL. The upper substrate 200 may include a second base substrate BS2 and an input sensing panel ISL disposed on the second base substrate BS2.

In the present embodiment, the display element layer DP-OLED may further include an encapsulation layer TFE. The encapsulation layer TFE is disposed on the light emitting element OLED and encapsulates the light emitting element OLED. Meanwhile, although not illustrated, a capping layer which covers the second electrode CE may further be disposed between the second electrode CE and the encapsulation layer TFE.

The encapsulation layer TFE may include a first inorganic layer LIL, an organic layer OEL, and a second inorganic layer UIL, all of which are sequentially laminated along the thickness direction. However, embodiments of the inventive concepts are not limited thereto, and the encapsulation layer TFE may further include a plurality of inorganic layers and a plurality of organic layers.

The first inorganic layer LIL may cover the second electrode CE. The first inorganic layer LIL may prevent external moisture or oxygen from penetrating into the light emitting layer OLED. For example, the first inorganic layer LIL may include silicon nitride, silicon oxide, or a compound thereof. The first inorganic layer LIL may be formed through a chemical vapor deposition process.

The organic layer OEL may be disposed on the first inorganic layer LIL and come into contact with the first inorganic layer LIL. The organic layer OEL may provide a flat surface on the first inorganic layer LIL. Bumps formed on an upper surface of the first inorganic layer LIL, or particles present on the first inorganic layer LIL are covered by the organic layer OEL so that the surface state of the upper surface of the first inorganic layer LIL may be prevented from affecting components formed on the organic layer OEL. In addition, the organic layer OEL may relieve stress between contacting layers. The organic layer OEL may include an organic material, and may be formed though a solution process such as spin coating, slit coating, and ink jet processes.

The second inorganic layer UIL is disposed on the organic layer OEL and covers the organic layer OEL. The second inorganic layer UIL may be stably formed on a relatively flat surface than being disposed on the first inorganic layer LIL. The second inorganic layer UIL encapsulates moisture and the like discharged from the organic layer OEL and prevents the moisture from introducing to the outside. The second inorganic layer UIL may include silicon nitride, silicon oxide, or a compound thereof. The second inorganic layer UIL may be formed through a chemical vapor deposition process.

An input sensing panel ISL is disposed on the encapsulation layer TFE. the input sensing panel ISL may be disposed directly on the encapsulation layer TFE and formed through a continuous process with the encapsulation layer TFE. Therefore, the input sensing panel ISL may be referred to as a "layer." However, embodiments of the inventive concepts are not limited thereto. The input sensing panel ISL may be provided as a separate unit and disposed on the encapsulation layer TFE through an adhesive member (not shown) disposed on the encapsulation layer TFE.

The input sensing panel ISL may include a plurality of conductive patterns and a plurality of sensing insulation layers. The input sensing panel ISL may sense an external input. For example, the external input may include various forms of input provided from the outside of the display apparatus DD. The external input applied from the outside may be provided in various forms. For example, the external input may include not only a contact by a part of a user's body, such as a hand, but also an external input applied in close proximity, or adjacent to the display apparatus DD at a predetermined distance (for example, hovering). Also, the external input may have various forms such as force, pressure, and light, but is not limited to any one embodiment.

The input sensing panel ISL may sense an external input by any one of a self-capacitance type method or a mutual capacitance type method. The conductive patterns included in the input sensing panel ISL may be variously changed in correspondence to a method to be disposed and connected.

The conductive patterns are disposed overlapping the non-light emitting region NPXA and disposed spaced apart from the light emitting region PXA. Accordingly, even when the conductive patterns are disposed on the display element layer DP-OLED, the interference with light generated in the pixel PX may be minimized.

Figure 4A:
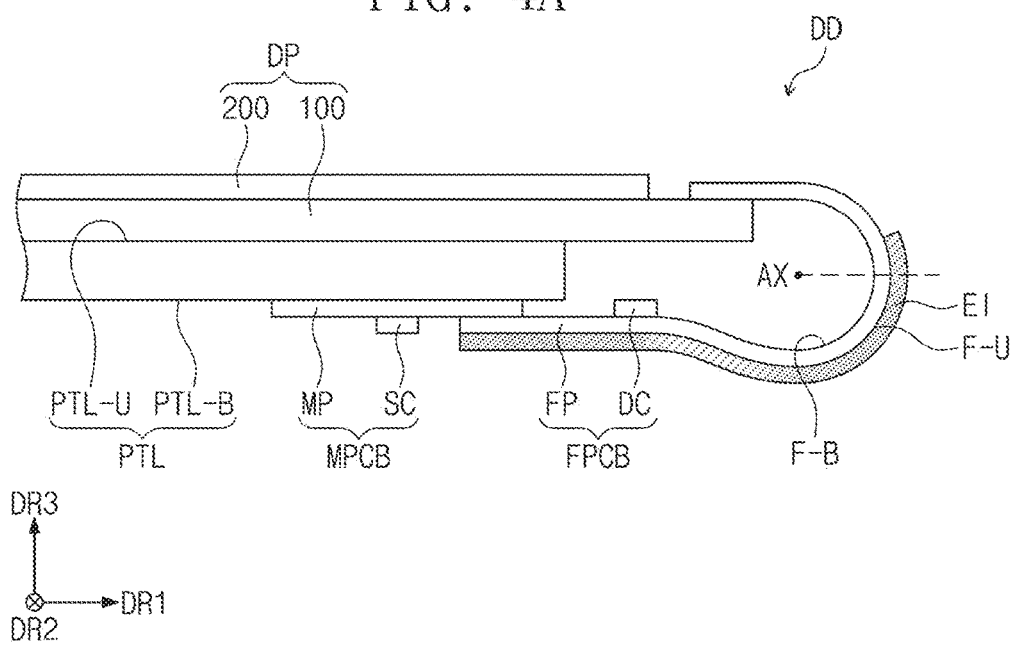
FIG. 4A is a cross-sectional view of a display apparatus according to an embodiment of the inventive concepts.
Figure 4B:
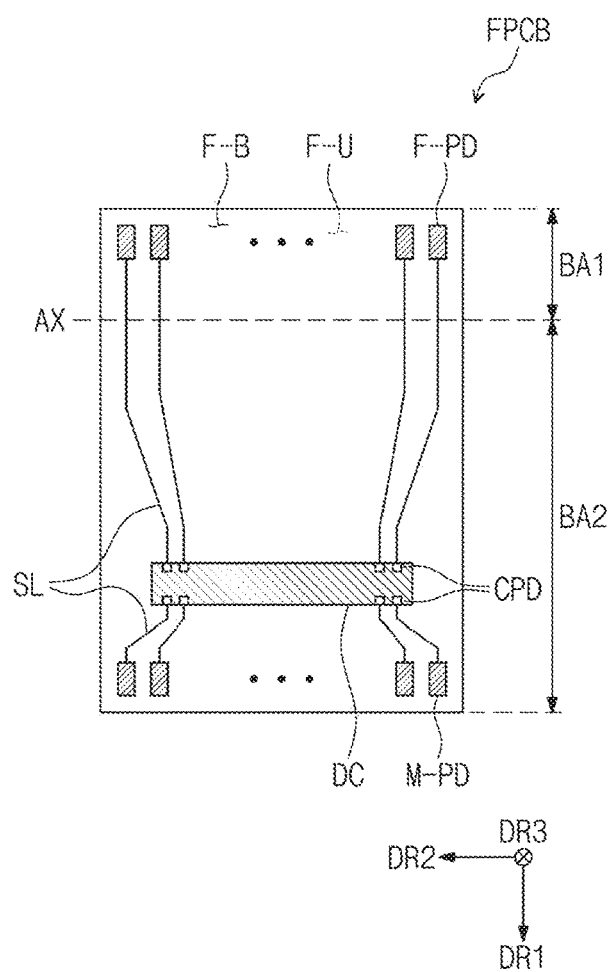
FIG. 4B is a back view of a flexible printed circuit board according to an embodiment of the inventive concepts.
Figure 4C:
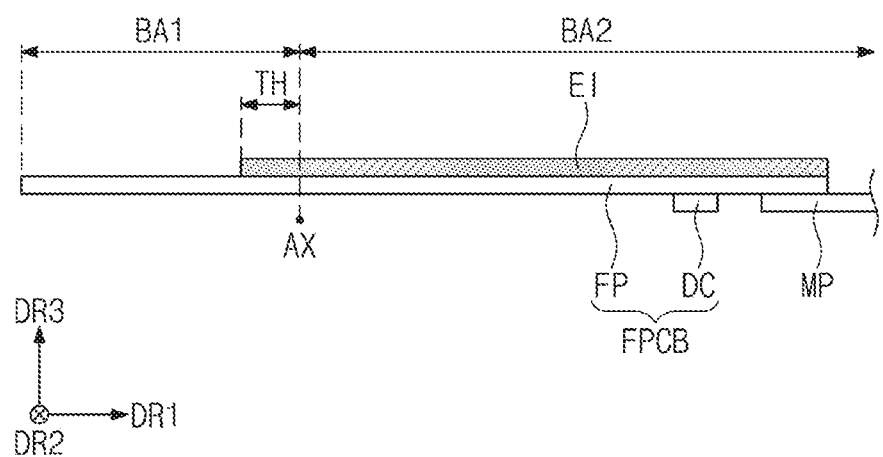
FIG. 4C is a cross-sectional view showing a flexible printed circuit board and a shielding member according to an embodiment of the inventive concepts.
Figure 5:
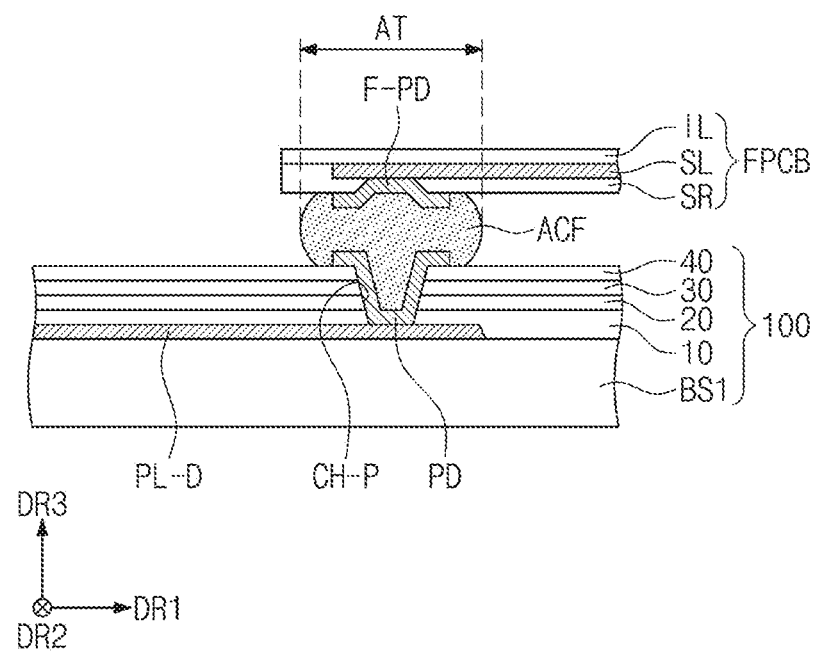
FIG. 5 is an enlarged cross-sectional view of a display panel and a flexible printed circuit board connected thereto shown in FIG. 4A.

FIG. 4A is a cross-sectional view of a display apparatus DD according to an embodiment of the inventive concepts. FIG. 4B is a back view of a flexible printed circuit board according to an embodiment of the inventive concepts. FIG. 4C is a cross-sectional view showing a flexible printed circuit board and a shielding member according to an embodiment of the inventive concepts. FIG. 5 is an enlarged cross-sectional view of a display panel and a flexible printed circuit board connected thereto shown in FIG. 4A. The same/similar reference numerals are used for the same/similar components as those of FIG. 1 to FIG. 3B, and redundant descriptions thereof are omitted.

In FIG. 4A, among the window WM, the display panel DP, the flexible printed circuit board FPCB, the main printed circuit board MPCB, the shielding member EI, the protection member PTL, and the housing member HM of the display apparatus DD, the window WM and the housing member HM are omitted. The main printed circuit board MPCB includes the main circuit board MP and the signal control unit SC, and the flexible printed circuit board FPCB includes the flexible circuit board FP and the driving chip DC.

The flexible printed circuit board FPCB according to the inventive concepts may be bent with a predetermined curvature. For example, the flexible printed circuit board FPCB may be bent with a predetermined curvature based on a virtual bending axis AX extended along the second direction DR2. Accordingly, a rear surface F-B of the flexible printed circuit board FPCB may be bent toward the rear surface of the display panel DP. At this time, the shielding member EI disposed on a front surface F-U of the flexible printed circuit board FPCB may also be bent, and the stress applied to the shielding member EI due to bending may be transferred to the flexible printed circuit board FPCB.

According to the inventive concepts, the shielding member EI exposes at least a portion of the front surface F-U of the flexible printed circuit board FPCB, thereby preventing or reducing the stress applied to the shielding member EI during bending from being transferred to the flexible printed circuit board FPCB. A detailed description thereof will be followed.

The protection member PTL includes a front surface PTL-U and a rear surface PTL-B opposite to the front surface PTL-U. The front surface PTL-U may come into contact with the display panel DP.

The main printed circuit board MPCB may be disposed on the rear surface PTL-B of the protection member PTL. For example, the main printed circuit board MPCB connected to the flexible printed circuit board FPCB may come into contact with the rear surface PTL-B of the protection member PTL during the bending of the flexible printed circuit board FPCB so that the main printed circuit board MPCB may be safely coupled to the protection member PTL.

FIG. 4B illustrates the rear surface F-B of the flexible printed circuit board FPCB according to an embodiment of the inventive concepts. The flexible printed circuit board FPCB according to the inventive concepts includes the front surface F-U and the rear surface F-B opposite to the front surface F-U. The flexible printed circuit board FPCB includes substrate signal lines SL, the driving chip DC disposed on the rear surface F-B, a plurality of substrate pads F-PD and M-PD exposed from the rear surface F-B, and connection pads CPD.

The connection pads CPD are connected to connection terminals of the driving chip DC. The substrate pads F-PD and M-PD may include first pads F-PD connected to the display panel DP and second pads M-PD connected to the main printed circuit board MPCB.

The substrate signal lines SL connect the connection pads CPD and the first pads F-PD, and connects the connection pads CPD and the second pads M-PD. When the driving chip DC is omitted, the substrate signal lines SL may connect the first pads F-PD and the second pads M-PD.

Another flexible printed circuit board FPCB of the inventive concepts may include, based on the bending axis AX extended along the second direction DR2, a first bending region BA1 and a second bending region BA2 arranged in the first direction DR1.

When the flexible circuit board FPCB is bent as shown in FIG. 4A, the first bending region BA1 and the second bending region BA2 may be divided based on a point of intersection between the flexible printed circuit board FPCB and the bending axis AX in the first direction DR1.

According to the inventive concepts, the point of intersection between the flexible circuit board FPCB and the bending axis AX in the first direction DR1 may be defined as a point having the smallest radius of curvature in the flexible printed circuit board FPCB. Therefore, the point of intersection between the flexible circuit board FPCB and the bending axis AX in the first direction DR1 during bending may be a portion having the biggest stress applied during the bending in the flexible printed circuit board FPCB.

Referring to FIG. 4C, the shielding member EI according to the inventive concepts may be disposed only on a portion of the flexible printed circuit board FPCB. For example, the shielding member EI may be disposed on a portion of the first bending region BA1 of the flexible printed circuit board FPCB and may be disposed on the entire surface of the second bending region BA2 to cover the second bending region BA2.

According to the present invention, in the shielding member EI, the length TH of the shielding member EI covering a portion of the first bending region BA1 from the boundary of the first bending region BA1 and the second bending region BA2 may be 300 μm or less.

When the length TH of the shielding member EI covering the portion of the first bending region BA1 is greater than 300 μm, the stress applied to the shielding member EI due to bending is transferred to the flexible printed circuit board FPCB, and as a result, the display pads PD (see FIG. 2) of the display panel DP and the first pads F-PD of the flexible circuit board FPCB may be delaminated.

According to the inventive concepts, the shielding member EI disposed on the flexible printed circuit board FPCB exposes at least a portion of the flexible printed circuit board FPCB, so that the stress applied to the flexible printed circuit board FPCB by the shielding member EI may be reduced even during bending. In particular, according to the inventive concepts, the shielding member EI exposes one region overlapping a region in which the display panel DP and the flexible circuit board FPCB are bonded in the flexible printed circuit board FPCB, so that even when the flexible printed circuit board FPCB is bent, the delamination problem of the flexible printed circuit board FPCB and the display panel DP may be solved and the display apparatus DD with improved reliability may be provided.

A first display substrate 100 shown in FIG. 5 may correspond to the first display substrate 100 shown in FIG. 4A.

Referring to FIG. 5, a display pad PD is connected to an auxiliary signal line PL-D through the contact-hole CH-P passing through the first to fourth insulation layers 10 to 40 disposed on the first base substrate BS1. The display pad PD is exposed from the first to fourth insulation layers 10 to 40. When the display pad PD is omitted, an end portion of the auxiliary signal line PL-D may be exposed from the first to fourth insulation layers 10 to 40.

As the flexible printed circuit board FPCB, a flexible printed circuit board FPCB including an insulation layer IL, a substrate signal line SL, a solder resist layer SR, and a first pad F-PD is exemplarily shown.

The solder resist layer SR may have an opening exposing at least a portion of the substrate signal line SL. The first pad F-PD may be connected to the substrate signal line SL exposed by the opening of the solder resist layer SR. The first pad F-PD is electrically connected to the display pad PD through an anisotropic conductive film ACF.

The anisotropic conductive Film ACF according to the present embodiment may include an adhesive resin and a plurality of conductive balls dispersed in the adhesive resin. The adhesion resin may include a resin as an example.

The anisotropic conductive film ACF is disposed between the first pad F-PD and the display pad PD and may bond the first pad F-PD and the display pad PD through a heat compression process.

In the present embodiment, the bonding length AT of the anisotropic conductive film ACF in the first direction may be 150 μm to 250 μm. When the bonding length AT is less than 150 μm, the anisotropic conductive film ACF applied between the first pad F-PD and the display pad PD may not be able to bond the first pad F-PD and the display pad PD even during heat pressing, so that the problem of delamination between the first pad F-PD and the display pad PD may occur. When the bonding length AT is greater than 250 μm, a region in which the flexible circuit board FPCB is to be in contact with the display panel DP is widened, so that unnecessary space may be generated in the display panel DP.

Figure 6A:
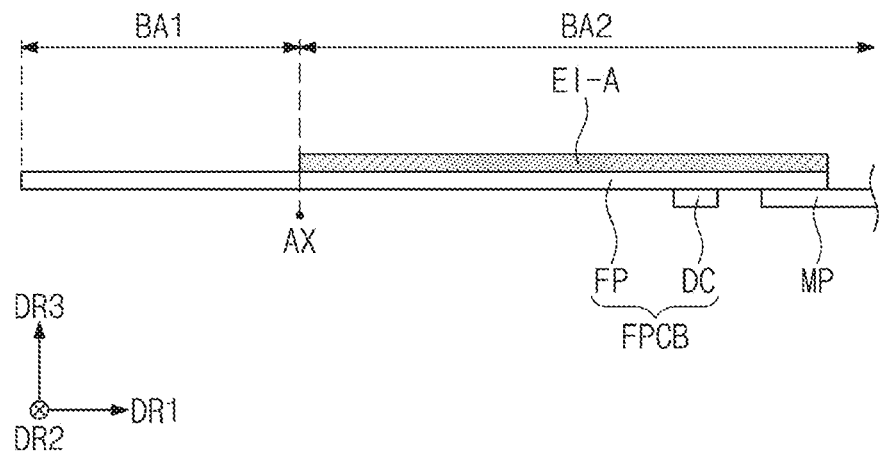
FIG. 6A is a cross-sectional view showing a flexible printed circuit board and a shielding member according to an embodiment of the inventive concepts.
Figure 6B:
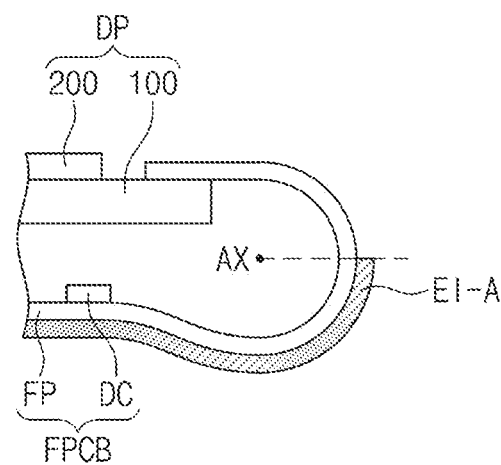
FIG. 6B is a cross-sectional view of some components of a display apparatus according to an embodiment of the inventive concepts.
Figure 7A:
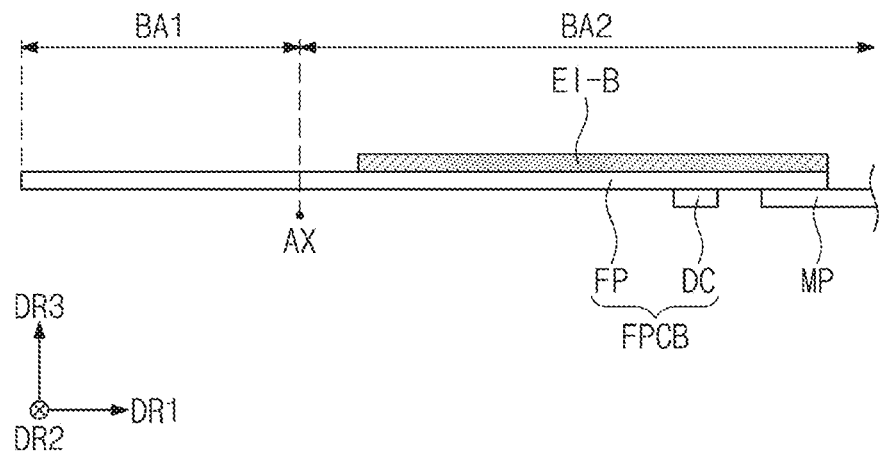
FIG. 7A is a cross-sectional view showing a flexible printed circuit board and a shielding member according to an embodiment of the inventive concepts.
Figure 7B:
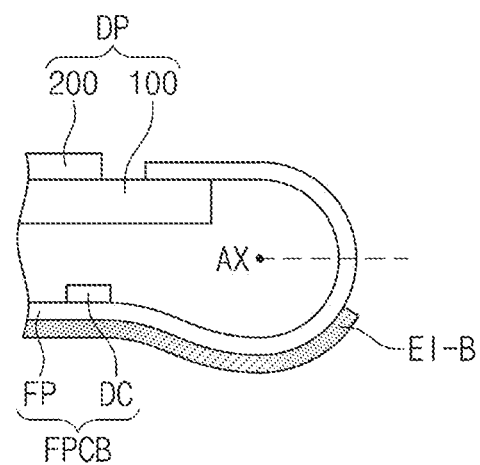
FIG. 7B is a cross-sectional view of some components of a display apparatus according to an embodiment of the inventive concepts.
Figure 7B:
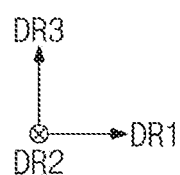

FIG. 6A is a cross-sectional view showing a flexible printed circuit board and a shielding member according to an embodiment of the inventive concepts. FIG. 6B is a cross-sectional view of some components of a display apparatus according to an embodiment of the inventive concepts. FIG. 7A is a cross-sectional view showing a flexible printed circuit board and a shielding member according to an embodiment of the inventive concepts. FIG. 7B is a cross-sectional view of some components of a display apparatus according to an embodiment of the inventive concepts. The same/similar reference numerals are used for the same/similar components as those of FIG. 1 to FIG. 5, and redundant descriptions thereof are omitted.

Referring to FIG. 6A and FIG. 6B, a shielding member EI-A according to the inventive concepts may be disposed only in the second bending region BA2 in the flexible printed circuit board FPCB. Accordingly, the first bending region BA1 may be exposed from the shielding member EI-A. Therefore, in the state in which the flexible printed circuit board FPCB is bent along the bending axis AX, the end of the shielding member EI-A may come in contact with a virtual line extended from the bending axis AX in the first direction DR1.

Referring to FIG. 7A and FIG. 7B, a shielding member EI-B according to the inventive concepts may expose the entire surface of the first bending region BA1 and a portion of the second bending region BA2 in the flexible printed circuit board FPCB. Therefore, in the state in which the flexible printed circuit board FPCB is bent along the bending axis AX, the end of the shielding member EI-B may be spaced apart from a virtual line extended from the bending axis AX in the first direction DR1.

According to present embodiments, the end of the shielding member EI-A is disposed at a point having the smallest radius of curvature in the state in which the flexible circuit board FPCB is bent, or the shielding member EI-B is disposed spaced apart from a point having the smallest radius of curvature, so that stress due to the bending of the shielding members EI-A and EI-B may be mitigated even when the flexible circuit board FPCB is bent. In addition, a region in which the display panel DP and the flexible printed circuit board FPCB are bonded and a region in which the shielding members EI-A and EI-B are spaced apart, even when the flexible printed circuit board FPCB is bent, the delamination between the display panel DP and the flexible printed circuit board FPCB may be mitigated.

Figure 8:
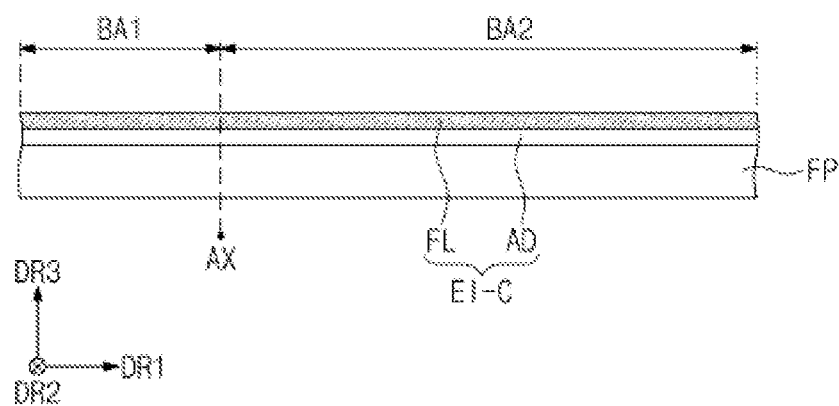
FIG. 8 is a cross-sectional view showing a flexible printed circuit board and a shielding member according to an embodiment of the inventive concepts.
Figure 9:
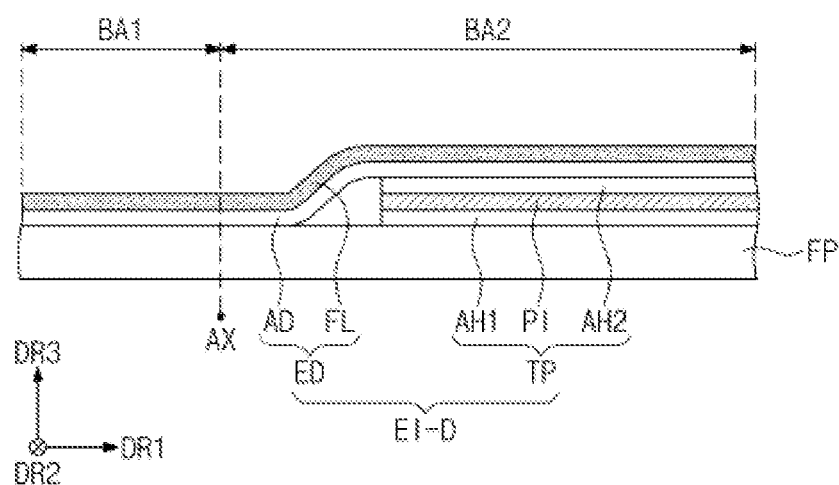
FIG. 9 is a cross-sectional view showing a flexible printed circuit board and a shielding member according to an embodiment of the inventive concepts.

FIG. 8 is a cross-sectional view showing a flexible printed circuit board and a shielding member according to an embodiment of the inventive concepts. FIG. 9 is a cross-sectional view showing a flexible printed circuit board and a shielding member according to an embodiment of the inventive concepts. The same/similar reference numerals are used for the same/similar components as those of FIG. 1 to FIG. 7, and redundant descriptions thereof are omitted.

Referring to FIG. 8 and FIG. 9, a shielding member EI-C according to the present embodiment may include an adhesion layer AD and a fabric layer FL. The adhesion layer AD may be disposed on the flexible printed circuit board FPCB and come into contact therewith. The fabric layer FL is disposed on the adhesion layer AD. The fabric layer FL is a layer including a fiber and is not limited to any material as long as the material has a shielding function.

In addition, referring to FIG. 9, a shielding member EI-D according to the present embodiment may further include a shielding layer ED and an adhesion film TP. In the present embodiment, the adhesion layer AD and the fabric layer FL included in the shielding layer ED may have the same configuration as the adhesive layer AD and the fabric layer FL described with reference to FIG. 8.

In the present embodiment, the adhesive film TP may include a first adhesion layer AH1, a film layer PI, and a second adhesion layer AH2.

The first adhesion layer AH1 may cover a portion of the flexible printed circuit board FPCB. The film layer PI is disposed on the first adhesion layer AH1, and may include a material capable of reducing stress during bending. For example, the film layer PI may include any one of polyimide (PI) and polyethylene terephthalate (PET). The second adhesion layer AH2 may be disposed on the film layer PI.

In FIG. 9, the adhesive film TP shown to be disposed only in the second bending region BA2 of the flexible circuit board FPCB. However, embodiments of the inventive concepts are not limited thereto. The end of the adhesive film TP may be disposed at the boundary of the first bending region BA1 and the second bending region BA2, or a portion of the adhesive film TP may cover a portion of the first bending region BA1, but is not limited to any one embodiment.

The adhesion layer AD of FIG. 8 and the first adhesion layer AH1 and the second adhesion layer AH2 of FIG. 9 may be provided as a tape having adhesion properties, or may be an organic adhesion layer such as such as an optically clear adhesive film (OCA) or an optically clear resin (OCR), or a pressure sensitive adhesive film (PSA). An organic adhesion layer may include an adhesive material such as a polyurethane-based adhesion material, a polyacrylic adhesive material, a polyester-based adhesive material, a polyepoxy-based adhesive material, a polyvinyl acetate-based adhesive material, and the like, but is not limited to any one embodiment.

In FIG. 9, the adhesive film TP is exemplarily shown to cover a portion of the second bending region BA2. However, embodiments of the inventive concepts are not limited thereto. The adhesive film TP may cover a portion of the first bending region BA1, or the end of the adhesive film TP may overlap the bending axis AX, but is not limited to any one embodiment.

Figure 10:
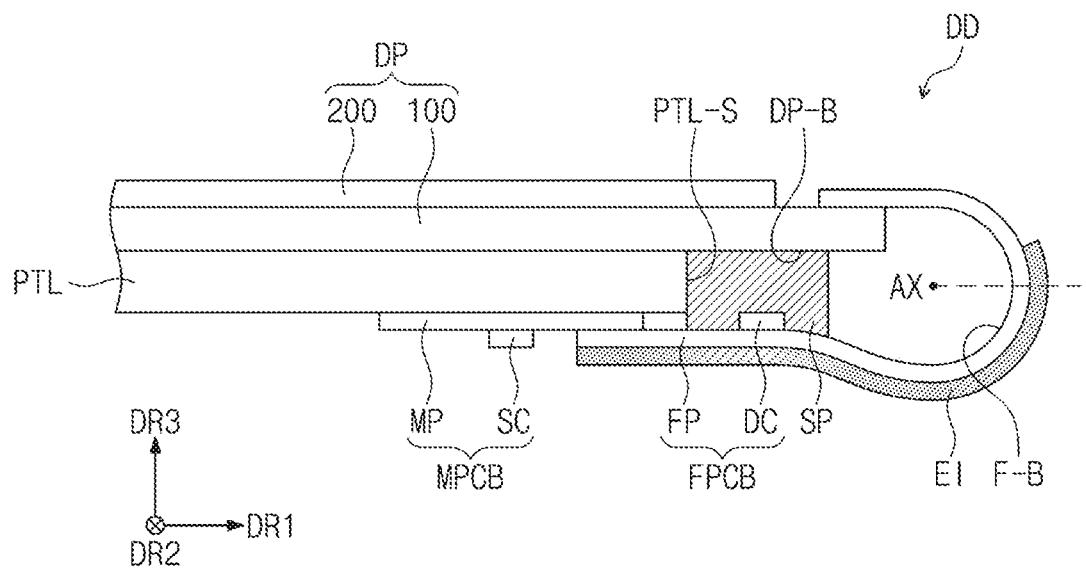
FIG. 10 is a cross-sectional view of a display apparatus according to an embodiment of the inventive concepts.
Figure 11:
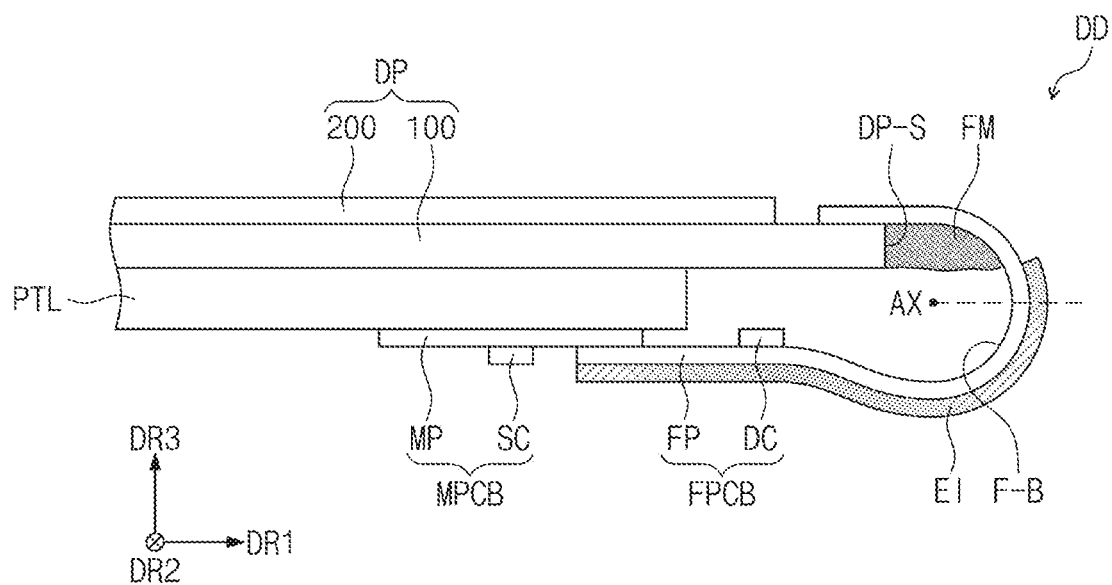
FIG. 11 is a cross-sectional view of a display apparatus according to an embodiment of the inventive concepts.
Figure 12:
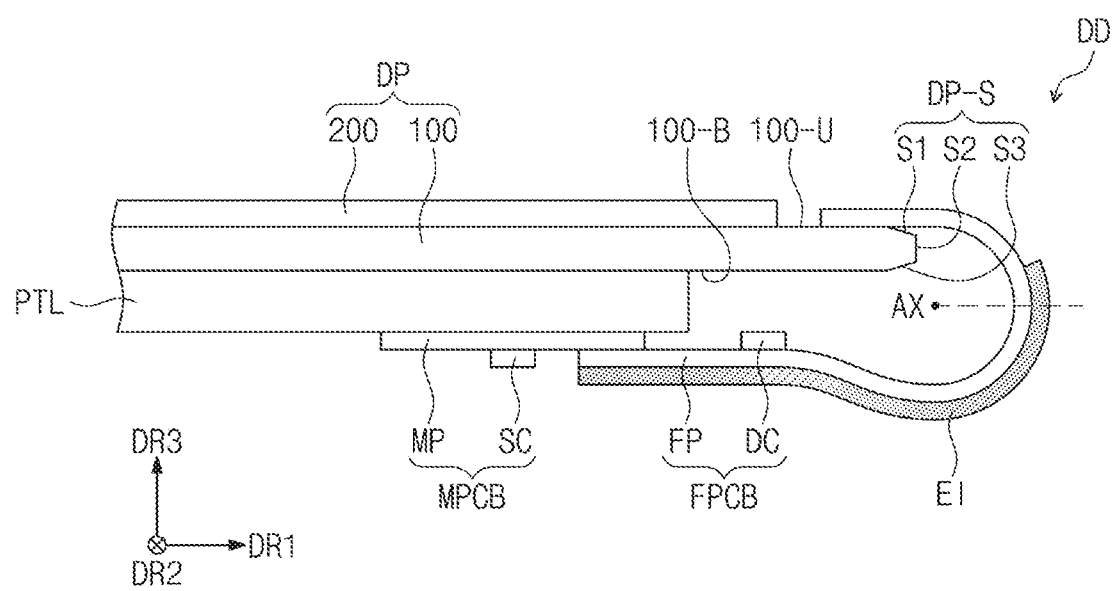
FIG. 12 is a cross-sectional view of a display apparatus according to an embodiment of the inventive concepts.

FIG. 10 is a cross-sectional view of a display apparatus DD according to an embodiment of the inventive concepts. FIG. 11 is a cross-sectional view of a display apparatus DD according to an embodiment of the inventive concepts. FIG. 12 is a cross-sectional view of a display apparatus DD according to an embodiment of the inventive concepts. The same/similar reference numerals are used for the same/similar components as those of FIG. 1 to FIG. 9, and redundant descriptions thereof are omitted.

Referring to FIG. 10, a display apparatus DD according to the present embodiment may include the display panel DP having the first display substrate 100 and the second display substrate 200, the flexible printed circuit board FPCB having the flexible circuit board FP and the driving chip DP, the main printed circuit board MPCB having the shielding member EI, the main circuit board MP and the signal control unit SC, and the protection member PTL, and may further include the spacer SP.

The display apparatus DD according to the inventive concepts may further include the spacer SP. The spacer SP may protect the driving chip DC from external impacts by covering the driving chip DC during bending.

In a bent state, the space SP may come in contact with one side surface PTL-S of the protection member PTL and a portion of the rear surface DP-B of the display panel DP. The spacer SP may surround the driving chip DC by being disposed on the rear surface F-B of the flexible printed circuit board FPCB on which the driving chip DC is disposed. The spacer SP is not limited to any material as long as the material is capable of absorbing impacts.

Referring to FIG. 11, a display apparatus DD according to the present embodiment may include the display panel DP having the first display substrate 100 and the second display substrate 200, the flexible printed circuit board FPCB having the flexible circuit board FP and the driving chip DP, the main printed circuit board MPCB having the shielding member EI, the main circuit board MP and the signal control unit SC, and the protection member PTL, and may further include a stress relief member FM.

The display apparatus DD according to the inventive concepts may further include the stress relief member FM. The stress relief member FM may be disposed adjacent to a region in which the display panel DP and the flexible printed circuit board FPCB are connected during bending. For example, the stress relief member FM may be disposed, among the side surfaces of the display panel DP, on a side surface DP-S of the display panel DP adjacent to a region in which the display panel DP and the flexible printed circuit board FPCB are connected and on a portion of the rear surface F-B of the flexible printed circuit board FPCB to reduce stress applied during the bending of the flexible printed circuit board FPCB. The stress relief member FM may include a resin.

Referring to FIG. 12, a display apparatus DD according to the present embodiment may include the display panel DP having the first display substrate 100 and the second display substrate 200, the flexible printed circuit board FPCB having the flexible circuit board FP and the driving chip DP, the main printed circuit board MPCB having the shielding member EI, the main circuit board MP and the signal control unit SC, and the protection member PTL.

One side surface among the side surfaces of the display panel DP according to the present embodiment may include inclined surfaces S1 and S3 having a predetermined angle and a side surface S2 connecting the inclined surfaces.

For example, among the side surfaces of the display panel DP, the one side surface DP-S of the display panel DP adjacent to the region in which the display panel DP and the flexible printed circuit board FPCB are connected may include a first inclined surface S1 inclined at predetermined angle from a front surface 100-U of the first display substrate 100, a second inclined surface S3 inclined at a predetermined angle from a rear surface 100-B of the first display substrate 100, and the side surface S2 extended in the third direction DR3 and connecting the inclined surfaces.

According to the present embodiment, one side surface of the display panel DP includes the inclined surfaces S1 and S3, and thus, may mitigate an impact applied from the edge of the display panel DP when the flexible printed circuit board FPCB is bent.

A display apparatus according to an embodiment of the inventive concepts includes a flexible printed circuit board connected to a display panel and bent with a predetermined radius of curvature, and a shielding member disposed on the flexible printed circuit board. The flexible printed circuit board is divided into a plurality of bending regions based on a point at which the radius of curvature is the smallest, and the shielding member exposes at least a portion of one bending region, so that stress applied to the flexible printed circuit board by the shielding member may be reduced even during bending.

As a result, even when the flexible printed circuit board is bent, the delamination problem of the flexible printed circuit board and a display panel may be solved and a display apparatus with improved reliability may be provided.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a display panel including a front surface and a rear surface opposite to the front surface and including a plurality of display pads disposed on the front surface and arranged in one direction;
a flexible printed circuit board connected to the display pads and bent toward the rear surface of the display panel along a virtual bending axis extending in the one direction;
a shielding member disposed on the flexible printed circuit board; and
a stress relief member connected to a rear surface of the flexible printed circuit board overlapping the first bending region and one side surface adjacent to the display pads of the display panel,
wherein:
the flexible printed circuit board includes, based on a point of intersection with the bending axis in the one direction, a first bending region adjacent to the display pads and a second bending region adjacent to the rear surface of the display panel, and the shielding member covers the second bending region; and
the shielding member includes an adhesion layer which is in contact with the flexible printed circuit board and a fabric layer disposed on the adhesion layer.

2. The display apparatus of claim 1, wherein the shielding member covers a portion of the first bending region.

3. The display apparatus of claim 2, wherein in the shielding member, a length of the shielding member covering the portion of the first bending region from a boundary of the first bending region and the second bending region is 300 µm or less.

4. The display apparatus of claim 1, wherein the shielding member further comprises an adhesive film disposed between the flexible printed circuit board and the adhesion layer, and the adhesive film includes:
a first adhesion layer covering the flexible printed circuit board;
a film layer disposed on the first adhesion layer and including any one of polyimide (PI) and polyethylene terephthalate (PET); and
a second adhesion layer disposed on the film layer.

5. The display apparatus of claim 1, wherein the flexible printed circuit board comprises a flexible circuit board including a front surface on which the shielding member is disposed and a rear surface opposite to the front surface, and a driving chip mounted on the rear surface of the flexible circuit board.

6. The display apparatus of claim 5, further comprising a spacer disposed on the rear surface of the flexible circuit board and surrounding the driving chip.

7. The display apparatus of claim 5, wherein the display panel comprises side surfaces connecting the front surface of the display panel and the rear surface of the display panel, and the display apparatus further comprises, a stress relief member in contact with the rear surface of the flexible printed circuit board overlapping one side surface adjacent to the display pads among the side surfaces and the first bending region.

8. The display apparatus of claim 1, further comprising a protection member disposed between said display panel and the second bending region.

9. The display apparatus of claim 8, further comprising a main printed circuit board connected to the second bending region, wherein the main printed circuit board is disposed on the protection member.

10. The display apparatus of claim 1, wherein the display panel comprises side surfaces connecting the front surface of the display panel and the rear surface of the display panel, and
one side surface among the side surfaces which is adjacent to the display pads includes:
a first inclined surface inclined at a predetermined angle from the front surface of the display panel;
a second inclined surface inclined at a predetermined angle from the rear surface of the display panel; and
a side surface connecting the first inclined surface and the second inclined surface.

11. The display apparatus of claim 1, wherein the display pads and the flexible circuit board are bonded using an anisotropic conductive film (ACF), and a bonding length of the anisotropic conductive film in a cross direction intersecting the one direction is 150 μm to 250 μm.

12. A display apparatus comprising:
a display panel including a front surface and a rear surface opposite to the front surface and including a plurality of display pads disposed on the front surface and arranged in one direction;
a flexible printed circuit board connected to the display pads and bent toward the rear surface of the display panel with a predetermined radius of curvature;
a shielding member disposed on the flexible printed circuit board; and
a stress relief member connected to a rear surface of the flexible printed circuit board overlapping the first bending region and one side surface adjacent to the display pads of the display panel,
wherein:
the flexible printed circuit board includes, based on a point at which the radius of curvature is smallest, a first bending region adjacent to the display pads and a second bending region adjacent to the rear surface of the display panel, and the shielding member covers the second bending region; and
the shielding member includes an adhesion layer which is in contact with the flexible printed circuit board and a fabric layer disposed on the adhesion layer.

13. The display apparatus of claim 12, wherein the shielding member covers a portion of the first bending region.

14. The display apparatus of claim 13, wherein in the shielding member, a length of the shielding member covering the portion of the first bending region from a boundary of the first bending region and the second bending region is 300 μm or less.

15. The display apparatus of claim 12, wherein the shielding member further comprises an adhesive film disposed between the flexible printed circuit board and the adhesion layer, and the adhesive film includes a first adhesion layer covering the flexible printed circuit board, a film layer disposed on the first adhesion layer and including any one of polyimide (PI) and polyethylene terephthalate (PET), and a second adhesion layer disposed on the film layer.

16. The display apparatus of claim 12, wherein the flexible printed circuit board comprises a flexible circuit board including a front surface on which the shielding member is disposed and a rear surface opposite to the front surface, and a driving chip mounted on the rear surface of the flexible circuit board.

17. The display apparatus of claim 16, further comprising a spacer disposed on the rear surface of the flexible circuit board and surrounding the driving chip.

18. The display apparatus of claim 12, wherein the display pads and the flexible circuit board are bonded using an anisotropic conductive film (ACF), and a bonding length of the anisotropic conductive film in a cross direction intersecting the one direction is 150 μm to 250 μm.

\* \* \* \* \*